US010297452B2

(12) United States Patent
Xie et al.

(10) Patent No.: US 10,297,452 B2
(45) Date of Patent: May 21, 2019

(54) METHODS OF FORMING A GATE CONTACT STRUCTURE FOR A TRANSISTOR

(71) Applicant: GLOBALFOUNDRIES Inc., Grand Cayman (KY)

(72) Inventors: Ruilong Xie, Niskayuna, NY (US); Hui Zang, Guilderland, NY (US); Kangguo Cheng, Schenectady, NY (US); Tenko Yamashita, Schenectady, NY (US); Chun-Chen Yeh, Danbury, CT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/712,301

(22) Filed: Sep. 22, 2017

(65) Prior Publication Data

US 2019/0096677 A1    Mar. 28, 2019

(51) Int. Cl.
| | |
|---|---|
| *H01L 29/78* | (2006.01) |
| *H01L 21/28* | (2006.01) |
| *H01L 29/417* | (2006.01) |
| *H01L 29/423* | (2006.01) |
| *H01L 29/66* | (2006.01) |

(52) U.S. Cl.
CPC .. *H01L 21/28061* (2013.01); *H01L 21/28132* (2013.01); *H01L 29/41725* (2013.01); *H01L 29/4232* (2013.01); *H01L 29/66477* (2013.01); *H01L 29/78* (2013.01)

(58) Field of Classification Search
CPC ......... H01L 21/28061; H01L 21/28132; H01L 29/41725; H01L 29/4232; H01L 29/66477; H01L 29/78
USPC ....................................................... 257/288
See application file for complete search history.

(56) References Cited

U.S. PATENT DOCUMENTS

| | | | | |
|---|---|---|---|---|
| 5,940,704 A | * | 8/1999 | Takeuchi | ............ G11C 11/5621 257/E21.68 |
| 2006/0226481 A1 | * | 10/2006 | Kim | .................. H01L 27/10891 257/347 |
| 2010/0181649 A1 | * | 7/2010 | Lung | .................... H01L 27/1026 257/588 |
| 2013/0273729 A1 | * | 10/2013 | Hempel | ............ H01L 21/82380 438/592 |

* cited by examiner

*Primary Examiner* — Hrayr A Sayadian
(74) *Attorney, Agent, or Firm* — Amerson Law Firm, PLLC

(57) ABSTRACT

One illustrative method disclosed includes selectively forming sacrificial conductive source/drain cap structures on and in contact with first and second source/drain contact structures positioned on opposite sides of a gate of a transistor and removing and replacing the spaced-apart sacrificial conductive source/drain cap structures with first and second separate, laterally spaced-apart insulating source/drain cap structures that are positioned on the first and second source/drain contact structures. The method also includes forming a gate contact opening that extends through a space between the insulating source/drain cap structures and through the gate cap so as to expose a portion of the gate structure and forming a conductive gate contact structure (CB) that is conductively coupled to the gate structure.

20 Claims, 14 Drawing Sheets

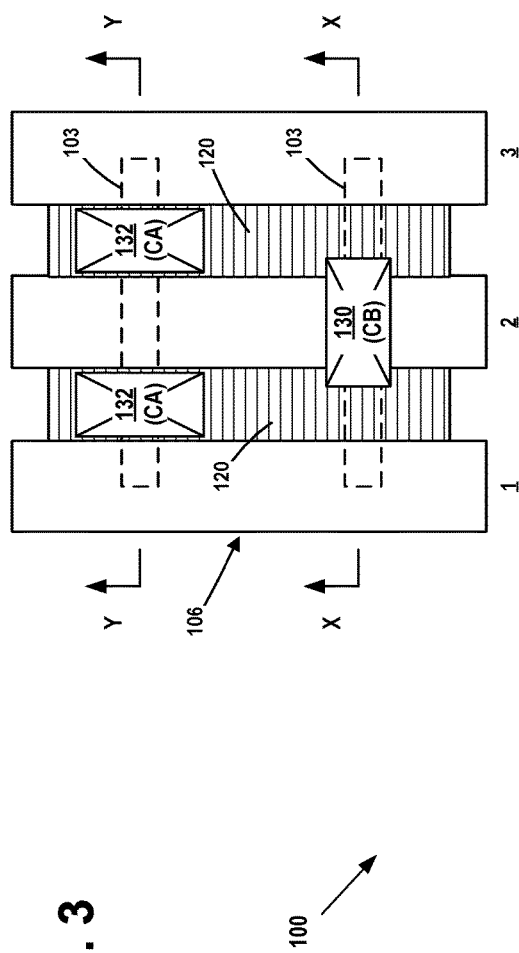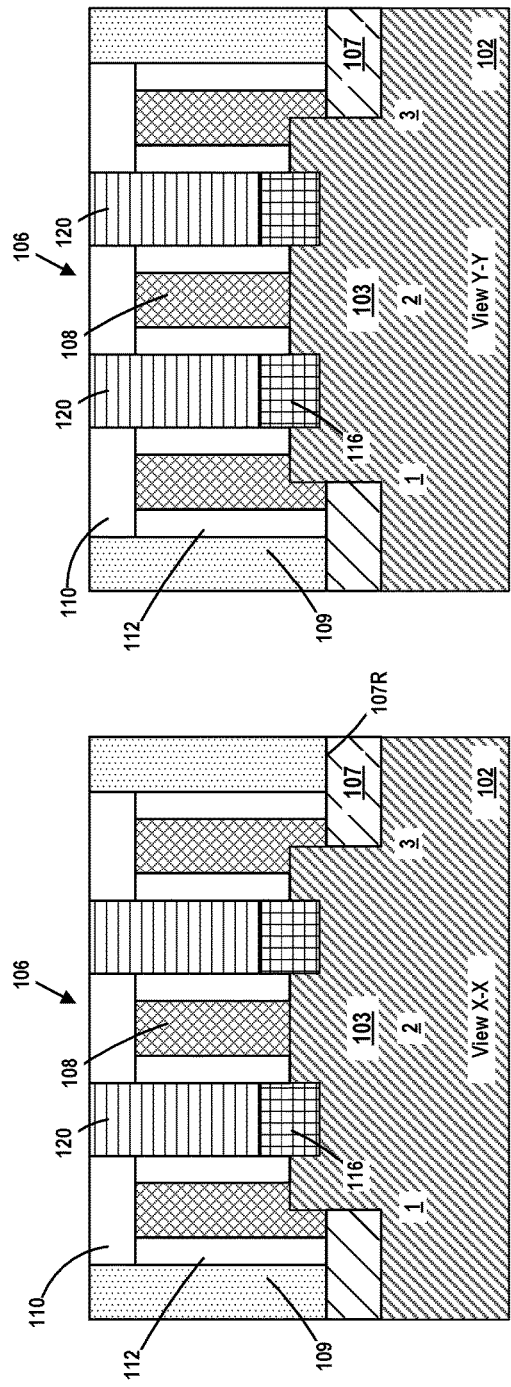
Fig. 3

METHODS OF FORMING A GATE CONTACT STRUCTURE FOR A TRANSISTOR

BACKGROUND OF THE INVENTION

1. Field of the Invention

The present disclosure generally relates to the fabrication of integrated circuits, and, more particularly, to various methods of forming a gate contact structure for a transistor and the resulting devices.

2. Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures that are generally referred to as device-level contacts (explained more fully below). In some more advanced devices, another metallization layer comprised of conductive lines (sometimes called the "M0" layer) is formed between the device level contacts and the V0 vias.

There are also other so-called device level contacts positioned below the lowermost layer of the metallization system on an IC product. For example, such device level contacts include a plurality of so-called "CA contact" structures for establishing electrical connection to the source/drain regions of a transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB contact and the TS conductive structures formed in the source/drain regions of the transistor, i.e., there is a minimum spacing that must be maintained between these two structures according to various design rules in an attempt to prevent such electrical shorts. Unfortunately, there is an area penalty associated with the requirement that the CB contact only be positioned above the isolation region.

Efforts have been made to create process flows whereby the CB contact is formed entirely over the active area. Unfortunately, such process flows typically involve many additional process steps and may require the use of new materials. Such complex processing also inherently increases the chances of reduced product yields. What is needed is a method for forming the CB gate contact so as to conserve valuable plot space on an integrated circuit product that is less complex than the processes whereby the CB contact is formed entirely over the active region. What is further needed is a less complex process flow for forming the CB contact entirely over the active area.

The present disclosure is directed to various methods of forming a gate contact structure for a transistor and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate contact structure for a transistor and the resulting novel devices. One illustrative method disclosed includes, among other things, selectively forming first and second separate, laterally spaced-apart sacrificial conductive source/drain cap structures on and in contact with first and second source/drain contact structures positioned on opposite sides of a gate of a transistor and removing and replacing the first and second separate, laterally spaced-apart sacrificial conductive source/drain cap structures with first and second separate, laterally spaced-apart insulating source/drain cap structures that are positioned on the first and second source/drain contact structures. In this example, the method also includes forming a gate contact opening that extends through a space between the separate, laterally spaced-apart insulating source/drain cap structures and through the gate cap so as to expose a portion of the gate structure and forming a conductive gate contact structure (CB) in the gate contact opening, wherein the conductive gate contact structure (CB) is conductively coupled to the gate structure.

One illustrative device disclosed herein includes a gate that comprises a gate structure and a gate cap positioned above the gate structure, first and second source/drain contact structures positioned on opposite sides of the gate and first and second separate, laterally spaced-apart insulating source/drain cap structures positioned in a layer of insulating material, the first and second separate, laterally spaced-apart insulating source/drain cap structures being positioned and on and in contact with an upper surface of the first and second source/drain contact structures, wherein a bottom surface of each of the first and second separate, laterally spaced-apart insulating source/drain cap structures is positioned at a level that is above a level of an upper surface of the gate cap. In this example, the device also includes a gate contact opening that extends through a space between the separate, laterally spaced-apart insulating source/drain cap structures and through the gate cap so as to expose a portion of the gate structure and a conductive gate contact structure (CB) positioned in the gate contact opening, wherein the conductive gate contact structure (CB) is conductively coupled to the gate structure and wherein the conductive gate contact structure (CB) lands on the upper surface of each of the separate, laterally spaced-apart insulating source/drain cap structures.

BRIEF DESCRIPTION OF THE DRAWINGS

The disclosure may be understood by reference to the following description taken in conjunction with the accompanying drawings, in which like reference numerals identify like elements, and in which:

FIGS. 3-14 depict various novel methods disclosed herein of forming a gate contact structure for a transistor and the resulting novel devices.

Figure 1:
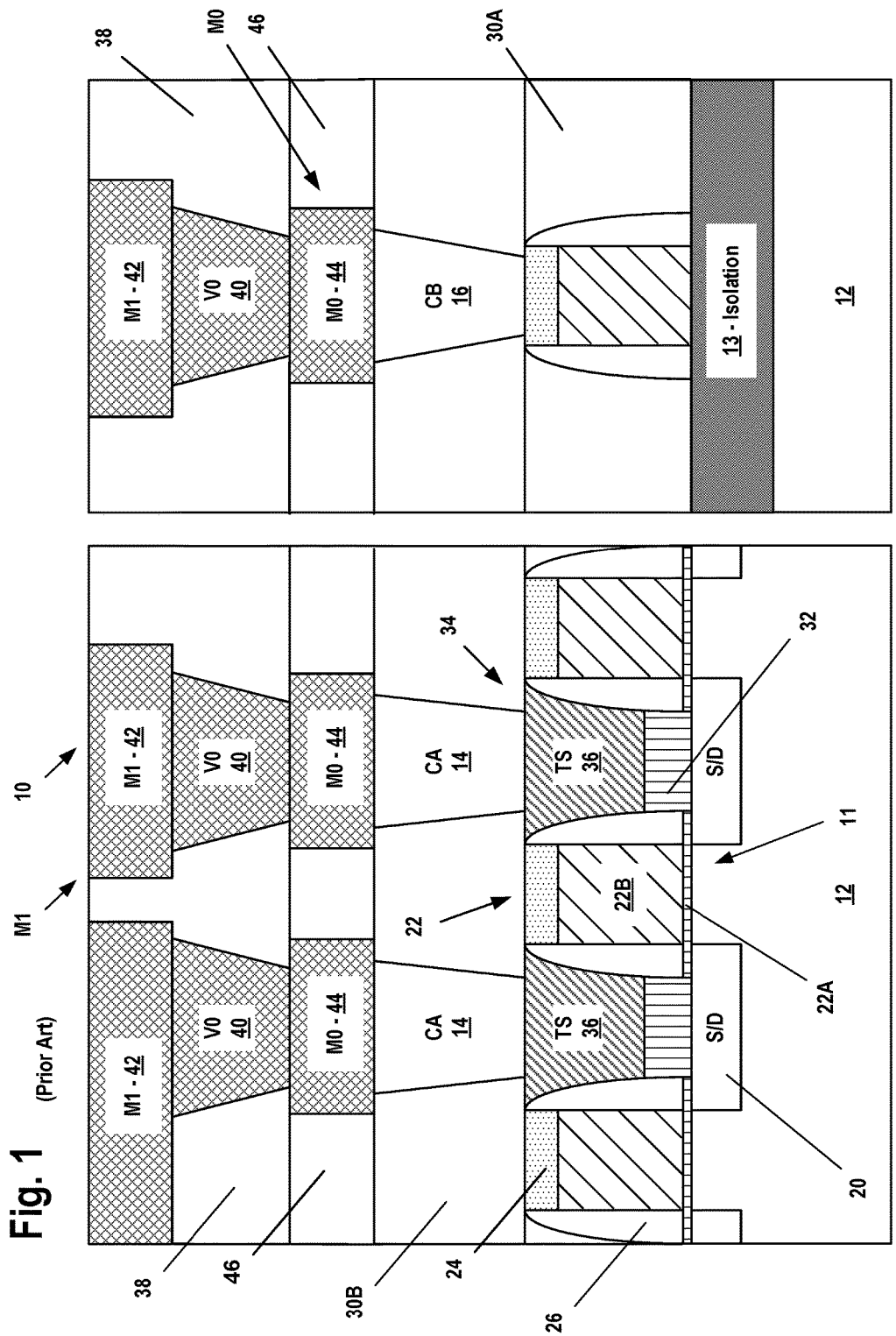
FIGS. 1-2 depict various illustrative prior art arrangements of device-level contacts and metallization layers for an integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of an illustrative prior art IC product 10 comprised of a transistor device 11 formed in and above a semiconductor substrate 12. Also depicted are a plurality of CA contact structures 14 for establishing electrical connection to the simplistically depicted source/drain regions 20 of the device 11, and a CB gate contact structure 16. The CB gate contact 16 is typically positioned vertically above isolation material 13 that surrounds the device 11, i.e., the CB gate contact 16 is typically not positioned above the active region defined in the substrate 12, but it may be in some advanced architectures.

The transistor 11 comprises an illustrative gate structure 22 (i.e., a gate insulation layer 22A and a gate electrode 22B), a gate cap 24, a sidewall spacer 26 and simplistically depicted source/drain regions 20. At the point of fabrication depicted in FIG. 1, layers of insulating material 30A, 30B, i.e., interlayer dielectric materials, have been formed above the substrate 12. Other layers of material, such as contact etch stop layers and the like, are not depicted in the drawing. Also depicted are illustrative raised epi source/drain regions 32 and source/drain contact structures 34, which typically include a so-called "trench silicide" (TS) structure 36. The CA contact structures 14 may be in the form of discrete contact elements, i.e., one or more individual contact plugs having a generally square-like shape or cylindrical shape when viewed from above, that are formed in an interlayer dielectric material. In other applications, the CA contact structures 14 may also be a line-type feature that contacts underlying line-type features, e.g., the TS structure 36 that contacts the source/drain region 20 typically extends across the entire active region on the source/drain region 20 in a direction that is parallel to the gate width direction of the transistor 11, i.e., into and out of the plane of the drawing in FIG. 1. The CA contacts 14 and the CB contact 16 are all considered to be device-level contacts within the industry.

The IC product 10 includes an M0 metallization layer of the multi-level metallization system for the product 10. The M0 metallization layer is formed in a layer of insulating material 46, e.g., a low-k insulating material, and it is formed to establish electrical connection to the device-level contacts—CA contacts 14 and the CB contact 16. Also depicted in FIG. 1 is the M1 metallization layer for the product 10 that is formed in a layer of insulating material 38, e.g., a low-k insulating material. A plurality of conductive vias—V0 vias 40—is provided to establish electrical connection between the M0 metallization layer and the M1 metallization layer. Both the M0 metallization layer and the M1 metallization layer typically include a plurality of metal lines 44, 42 (respectively) that are routed as needed across the product 10. The formation of the M0 metallization layer may be helpful in reducing the overall resistance of the circuits formed on the substrate 12. However, in some IC products, the M0 metallization layer may be omitted and the V0 vias 40 of the M1 metallization layer make contact with the CA contacts 14 and the CB contact 16.

Figure 2:
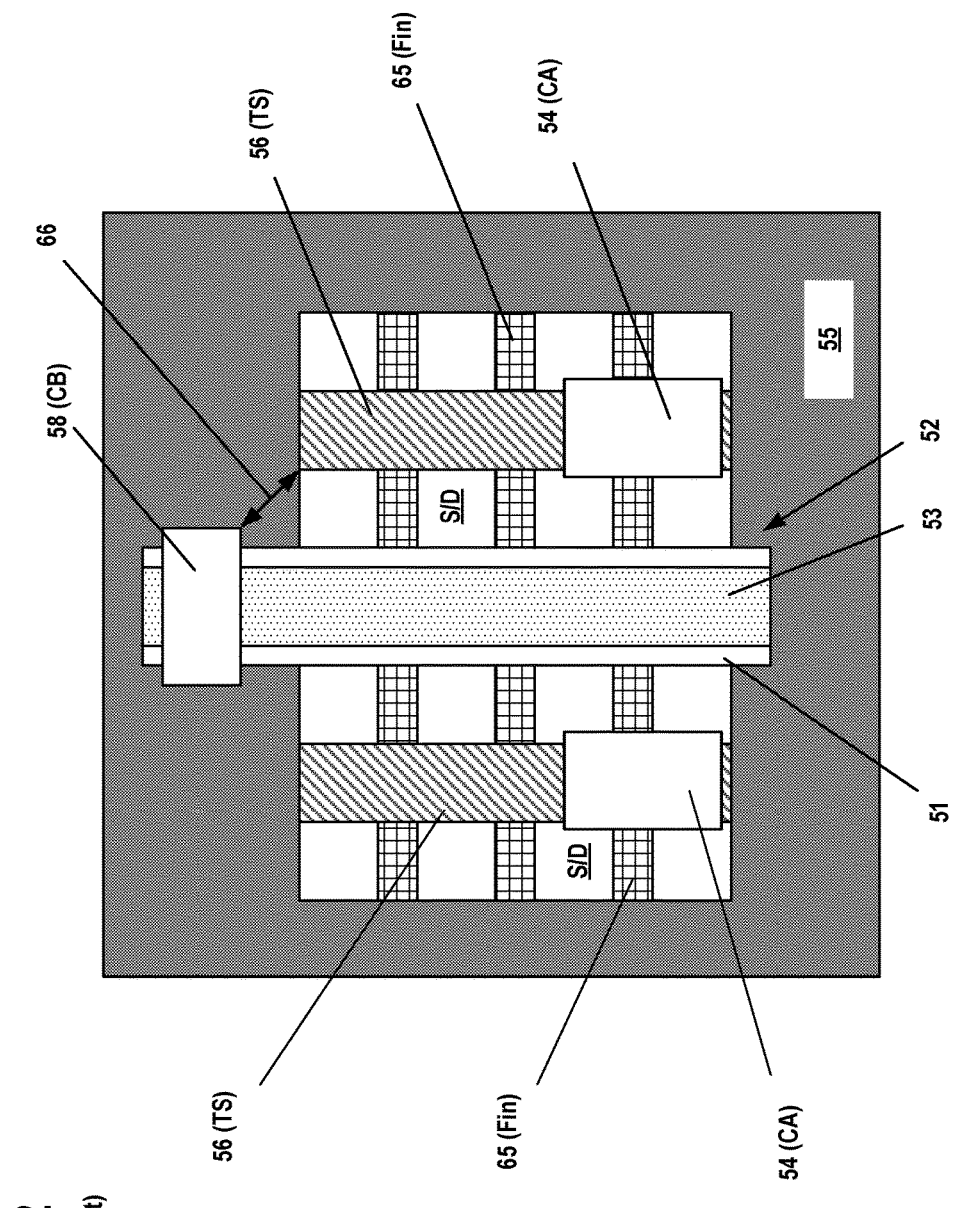

FIG. 2 is a simplistic plan view of a single FinFET transistor device 52. The transistor 52 comprises a plurality of illustrative fins 65, a gate cap layer 53, a sidewall spacer 51 and trench silicide structures 56 formed above the source/drain regions. Also depicted are a plurality of CA contact structures 54 for establishing electrical connection to the source/drain regions, and a CB gate contact structure 58 that is formed so as to establish electrical contact to the gate structure (not shown) by forming an opening in the gate cap 53.

As shown in FIG. 2, the CB gate contact 58 is typically positioned vertically above the isolation material 55 that surrounds the device 52, i.e., the CB gate contact 58 is typically not positioned above the active region, but it may be in some advanced architectures. The CB gate contact 58 is typically positioned above the isolation region 55 so as to avoid or reduce the chances of creating an electrical short between the CB contact 58 and the TS structure 56, i.e., there is a minimum spacing 66 that must be maintained between these two structures according to various design rules in an attempt to prevent such electrical shorts. Unfortunately, there is an area penalty associated with the requirement that the CB contact 58 only be positioned above the isolation region 55.

The present disclosure is directed to various novel methods of forming a gate contact structure for a transistor and the resulting novel devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 3-14 depict various novel methods disclosed herein for methods of forming a gate contact structure (CB) for a transistor on an integrated circuit (IC) product 100 and the resulting novel structures. FIG. 3 includes a simplistic plan view of one illustrative embodiment of an IC product 100. The product 100 generally comprises a plurality of gates 106 (numbered 1-3 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices. A plurality of fins 103 have been formed in the substrate 102 using traditional manufacturing techniques, and the gates 106 have been formed across the fins 103. Also depicted in the plan view are illustrative source/drain contact structures 120 (e.g., trench silicide structures) that are conductively coupled to the source/drain regions of the transistor devices. The plan view also depicts an illustrative CB gate contact structure 130 that will be formed to contact the gate structure 108 of gate 2. The CB gate contact structure 130 will be positioned above the active region of the transistor. As used herein, the term "active region" should be understood to be the area or "footprint" occupied by the two conductive source/drain contact structures 120 that are positioned on opposite sides of gate 2 as well as the portion of gate 2 itself that is positioned between the two source/drain contact structures 120. Also shown in the plan view in FIG. 3 are a plurality of CA contact structures 132 that will be formed to contact the source/drain contact structures 120.

The drawings included herein also include two cross-sectional drawings ("X-X" and "Y-Y") that are taken where indicated in the plan view in FIG. 3. More specifically, the cross-sectional view X-X is taken through the gates 106 in a gate-length direction of the transistor devices at a location where the CB gate contact structure 130 will be formed. In the case where the transistor devices are FinFET devices, the view X-X should be understood to be a cross-sectional view taken through the long axis of a fin 103 of the transistor in a direction that corresponds to the gate length (current transport) direction of a FinFET device. The cross-sectional view Y-Y is taken through the gates 106 in a gate-length direction of the transistor devices at a location where the CA contact structures 132 will be formed.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 3 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103. The width and height of the fins 103 may vary depending upon the particular application. Additionally, the overall size, shape and configuration of the fin-formation trenches and fins 103 may vary depending on the particular application. Next, a layer of insulating material 107 (e.g., silicon dioxide) was then deposited so as to overfill the fin-formation trenches. A chemical mechanical polishing (CMP) process was then performed to planarize the upper surface of the layer of insulating material 107 with the upper surface of fins 103, thereby removing the patterned fin-formation hard mask. Next, a recess etching process was performed on the layer of insulating material 107 such that it has a recessed upper surface 107R that exposes a desired amount of the fins 103 above the recessed upper surface 107R.

Still with reference to FIG. 3, after the layer of insulating material 107 was recessed, the gates 106 were formed above the fins 103. Each of the gates 106 includes a schematically depicted final gate structure 108, a gate cap 110 and a sidewall spacer 112. The sidewall spacers 112 and the gate caps 110 may be comprised of a variety of different materials, such as silicon nitride, SiNC, SiN, SiCO, SiNOC, etc., and they may be made of the same or different materials. As will be appreciated by those skilled in the art after a complete reading of the present application, in one illustrative embodiment, the spacers 112 and the gate caps 110 may be made of the same material (e.g., silicon nitride), which makes processing less complex as compared to situations where the spacers 112 and gate caps 110 are made of different materials (i.e., the spacer material may be a material with a lower k value), but they both may be, for example, nitride-based materials that exhibit similar etch characteristics. Typically, when the gate structures 108 are manufactured using known replacement gate manufacturing techniques, the materials for the gate structures 108 are sequentially formed in gate cavities between the spacers 112 after removal of a sacrificial gate electrode (not shown) and a sacrificial gate insulation layer (not shown). The gate structures 108 are typically comprised of a high-k gate insulation layer (not shown) such as, hafnium oxide, a material having a dielectric constant greater than 10, etc., and one or more conductive material layers that function as the gate electrode of the gate structure 108. For example, one or more work-function adjusting metal layers and a bulk conductive material may be deposited to form the gate electrode structure.

Still referencing FIG. 3, prior to the formation of the final gate structures 108, epi semiconductor material 116 was formed on the exposed portions of the active regions 103 (or fins in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings. Also depicted are illustrative source/drain contact structures 120 which typically include a so-called "trench silicide" (TS) structure (not separately shown). As indicated, the upper surface of the source/drain contact structures 120 is typically approximately level with the upper surface of the gate caps 110.

After formation of the epi material 116, a layer of insulating material 109 (e.g., silicon dioxide) was blanket-deposited across the substrate. Thereafter a CMP process was performed to planarize the layer of insulating material 109 using the original gate caps (not shown) positioned above the sacrificial gate structures as a polish stop layer. At that point, traditional replacement gate manufacturing processes were performed to remove the original gate caps and the sacrificial gate structures and to form the final gate structure 108. At that point, the gate caps 110 were formed on the product 100. Next, portions of the insulating material 109 above the source/drain regions were removed and the above-referenced source/drain contact structures 120 were formed in the source/drain regions of the devices.

Figure 4:
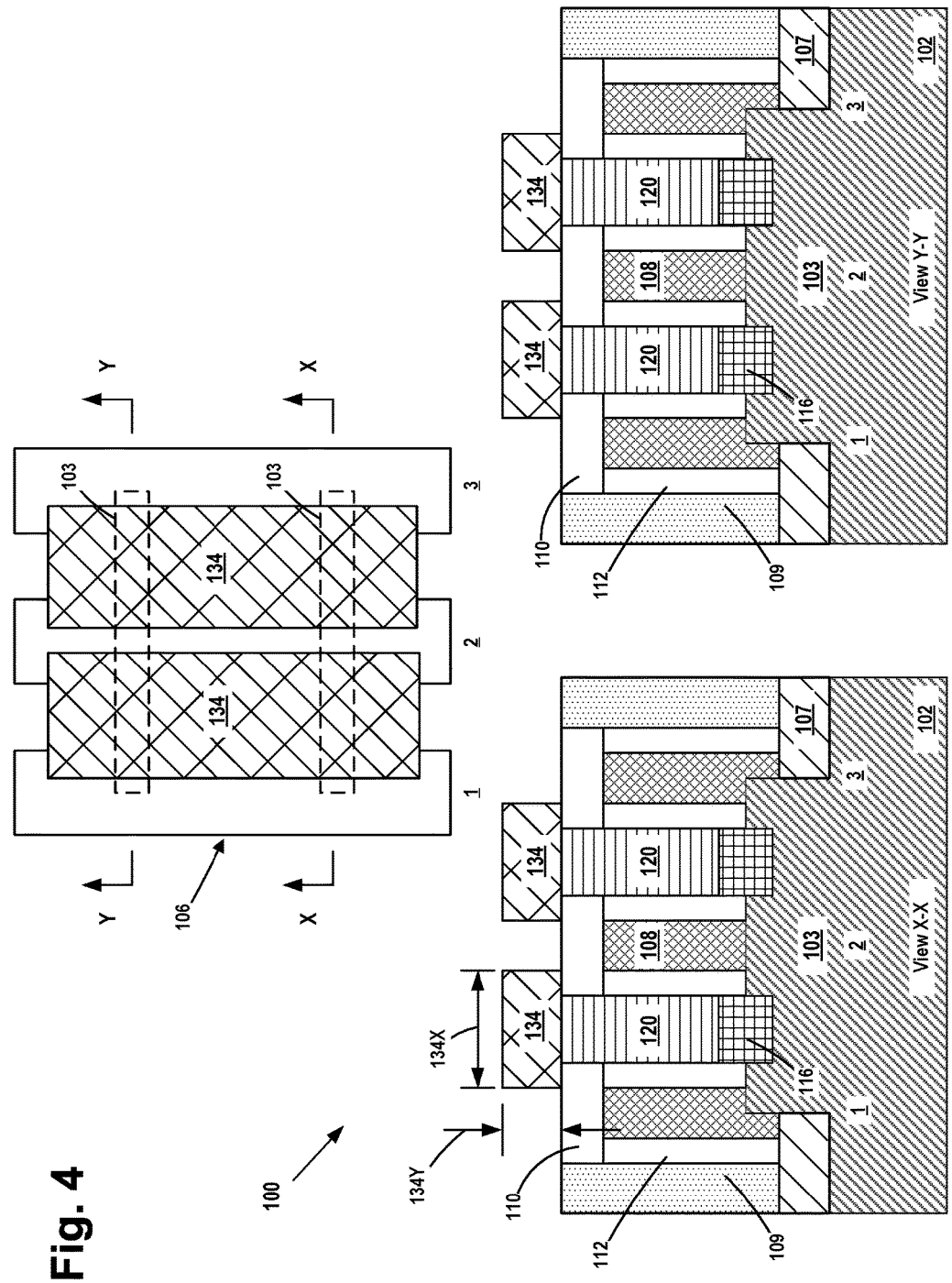

FIG. 4 depicts the IC product 100 after a selective metal deposition process was performed to form separate, laterally spaced-apart sacrificial conductive source/drain cap structures 134 on the exposed upper surfaces of the source/drain contact structures 120. For example, the separate, laterally spaced-apart sacrificial conductive source/drain cap structures 134 may be formed by performing a selective metal deposition process to diposit a metal or metal-containing conductive material, such as, for example, cobalt developed by Lam Research. The sacrificial conductive source/drain cap structures 134 may be comprised of any of a variety of different metals or metal-containing materials, such as, for example, cobalt or tungsten. The size, shape and configuration of the sacrificial conductive source/drain cap structures 134 may vary depending upon the particular application. In the particular example depicted herein, where the source/drain contact structures 120 are line-type features that extend into and out of the drawing plane in FIG. 3 (i.e., they extend along the gate 3 in a direction corresponding to the gate width direction of the transistor devices), the separate, laterally spaced-apart sacrificial conductive source/drain cap structures 134 will also have a line-type configuration, as the sacrificial conductive source/drain cap structures 134 form selectively on the source/drain contact structures 120. The sacrificial conductive source/drain cap structures 134 have a lateral width 134X and a vertical height 134Y, the values of which may vary depending upon the particular application. In one illustrative example, the lateral width 134X of the sacrificial source/drain cap structures 134 should be large enough such that portions of the sacrificial source/drain cap structures 134 are positioned vertically above and cover the spacer 112 on gate 2.

Figure 5:
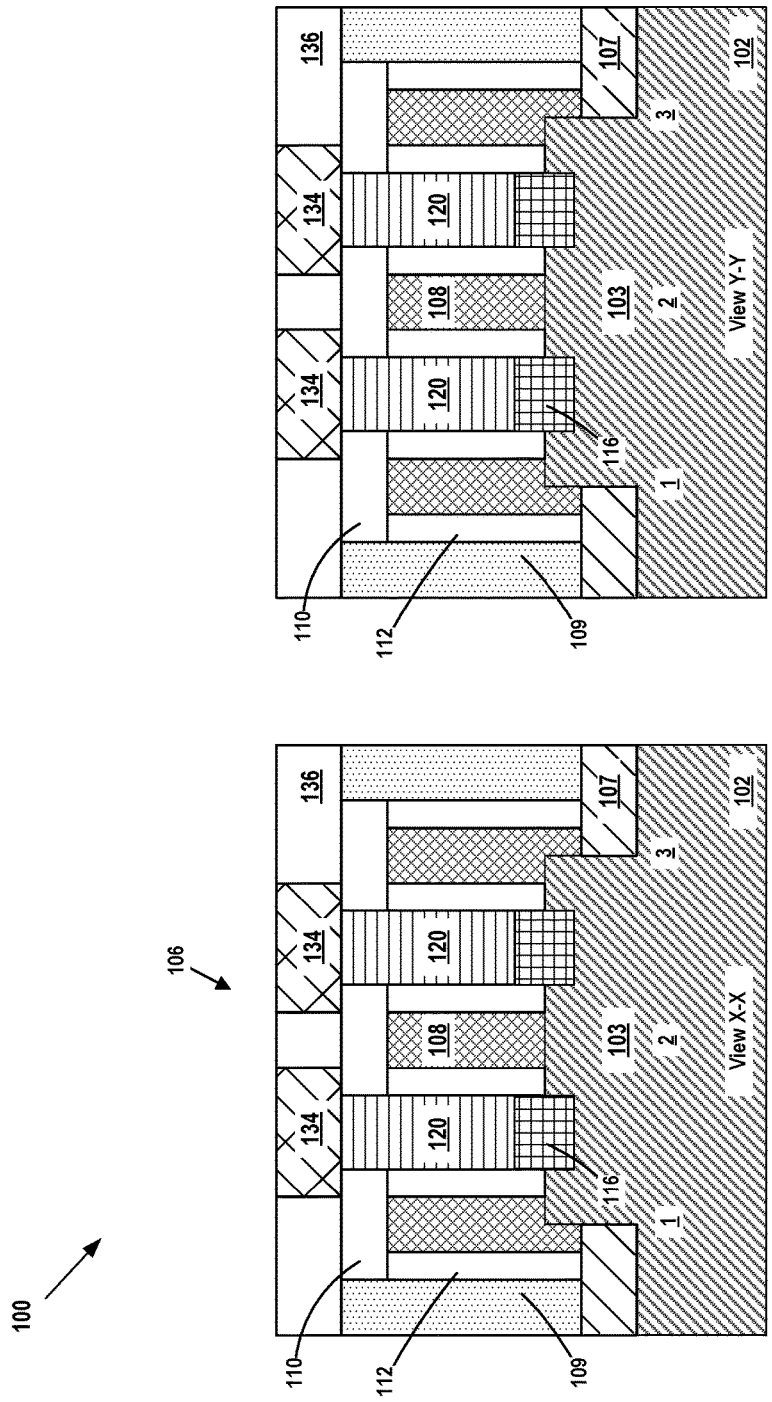

FIG. 5 depicts the product 100 after several process operations were performed. First, an insulating material 136, e.g., SiNC, SiN, SiCO, SiNOC, etc., was deposited across the substrate between and around the spaces between the separate, laterally spaced-apart sacrificial conductive source/drain cap structures 134. Thereafter, a CMP or etch-back process was performed to remove excess amounts of the insulating material 136 positioned above the upper surfaces of the sacrificial source/drain cap structures 134. As will be appreciated by those skilled in the art after a complete reading of the present application, in one illustrative embodiment, the spacers 112, the gate caps 110 and the insulating material 136 may be made of the same material (e.g., silicon nitride) or materials with similar etch behavior, such as nitride-based films, which will make the following processing less complex as compared to situations where the spacers 112, the gate caps 110 and the layer of insulating material 136 are all made of different materials.

Figure 6:
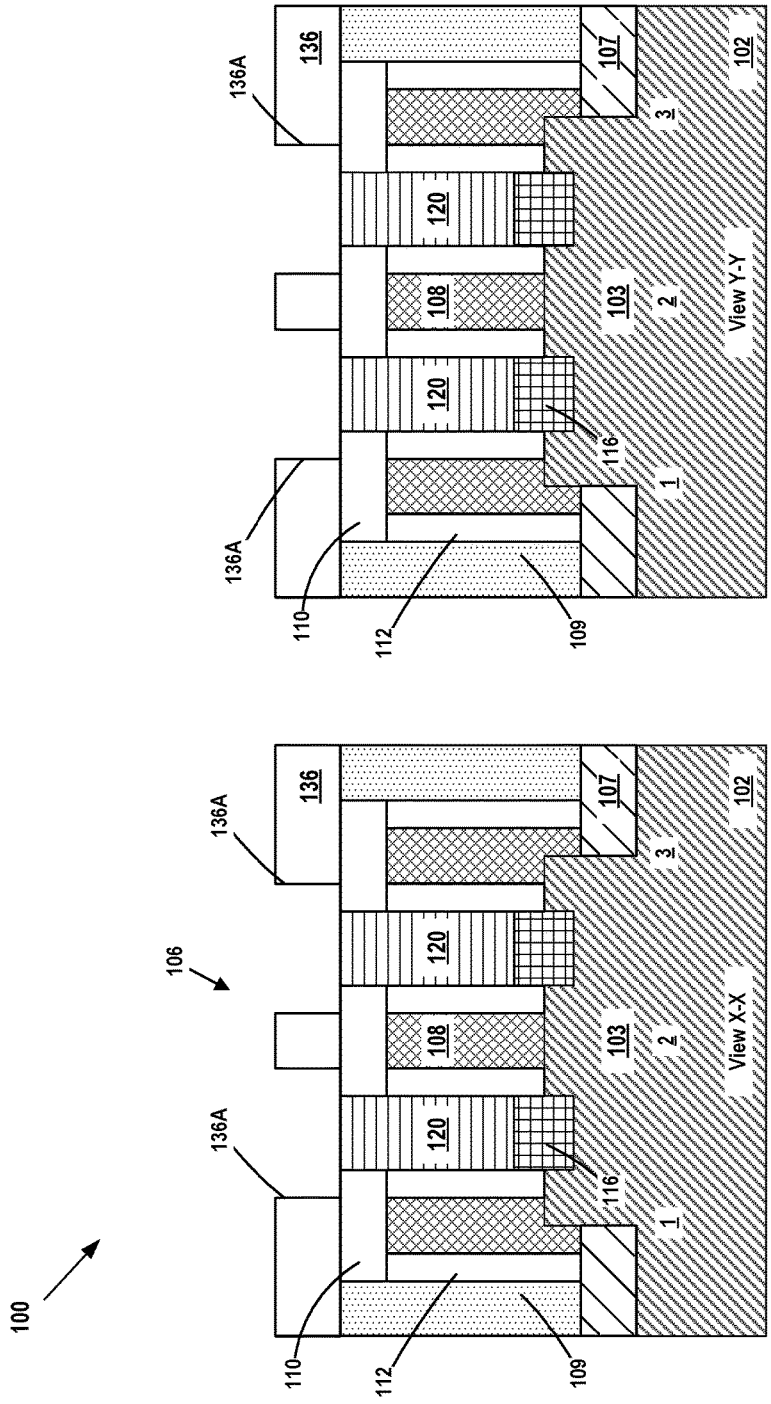

FIG. 6 depicts the product 100 after an etching process was performed to selectively remove the separate, laterally spaced-apart sacrificial conductive source/drain cap structures 134 relative to the surrounding structures and materials. This process operation effectively forms first and second openings 136A in the layer of insulating material 136 that expose the upper surfaces of the underlying source/drain contact structures 120.

Figure 7:
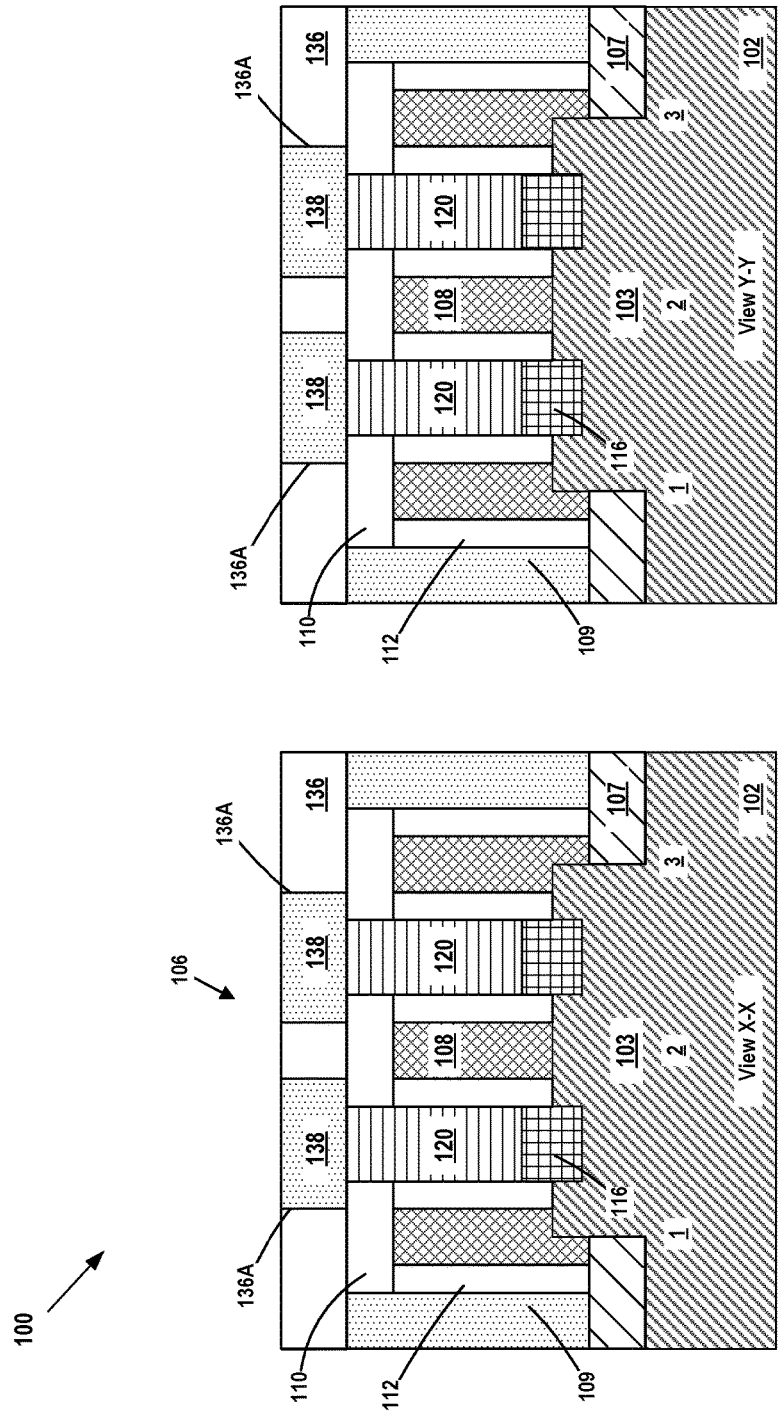

FIG. 7 depicts the product 100 after several process operations were performed. First, an insulating material 138, e.g., silicon dioxide, silicon nitride, SiNC, SiN, SiCO, SiNOC, etc., was deposited so as to over-fill the openings 136A. Next, a CMP or etch-back process was performed to remove excess amounts of the insulating material 138 positioned above the upper surface of the layer of insulating material 138. The remaining portions of the layer of insulating material 138 constitute separate, laterally spaced-apart insulating source/drain cap structures 138, each of which is positioned above one of the source/drain contact structures 120 for the entire axial length (in the gate width direction of the transistors) of the source/drain contact structure 120.

Basically, the separate, laterally spaced-apart sacrificial conductive source/drain cap structures 134 were removed and replaced with the separate, laterally spaced-apart insulating source/drain cap structures 138. Note that, in one embodiment, a bottom surface of each of the separate, laterally spaced-apart insulating source/drain cap structures 138 is positioned at a level that is above a level of an upper surface of the gate cap 110. In general, the material selected for the insulating source/drain cap structures 138 should exhibit good etch selectivity relative to the materials selected for the gate caps 110, the spacers 112 and the insulating material 136. For example, in one particular embodiment, the insulating source/drain cap structures 138 may be comprised of silicon dioxide, while the gate caps 110, the spacers 112 and the insulating material 136 are all made of silicon nitride.

Figure 8:
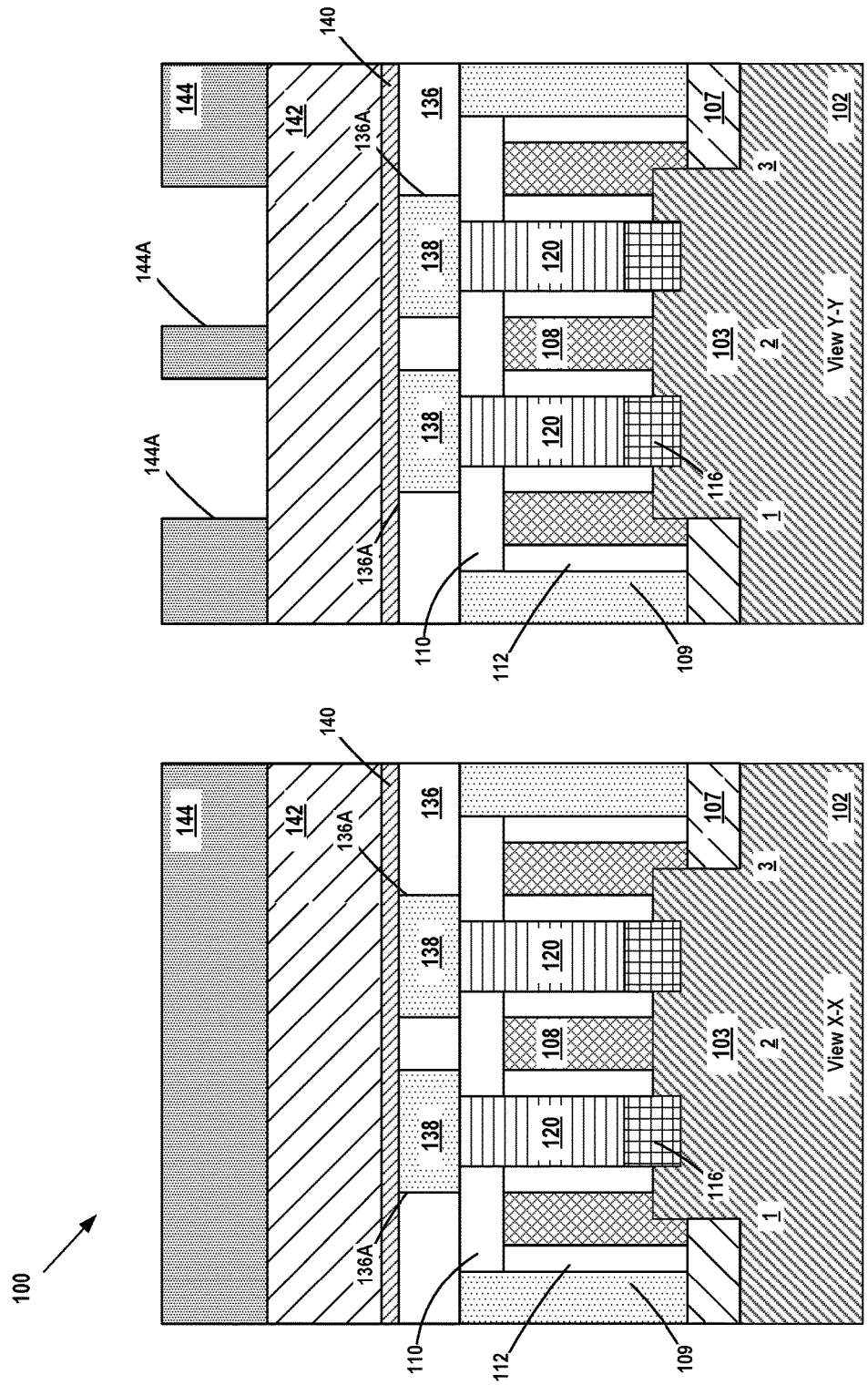

FIG. 8 depicts the product 100 after several process operations were performed. First, an optional etch stop layer 140 was formed above the substrate. Then, another layer of insulating material 142 was formed above the etch stop layer 140. Next, a patterned CA etch mask 144, (e.g., photoresist, OPL) was formed above the layer of insulating material 142. The patterned CA etch mask 144 comprises a plurality of CA contact openings 144A. The etch stop layer 140 (if formed) may be comprised of a variety of different materials (e.g., SiCO) that exhibit etch selectivity relative to surrounding materials. The layer of insulating material 142 may be comprised of a variety of different materials as well, e.g., silicon dioxide, a low-k insulating material, etc.

Figure 9:
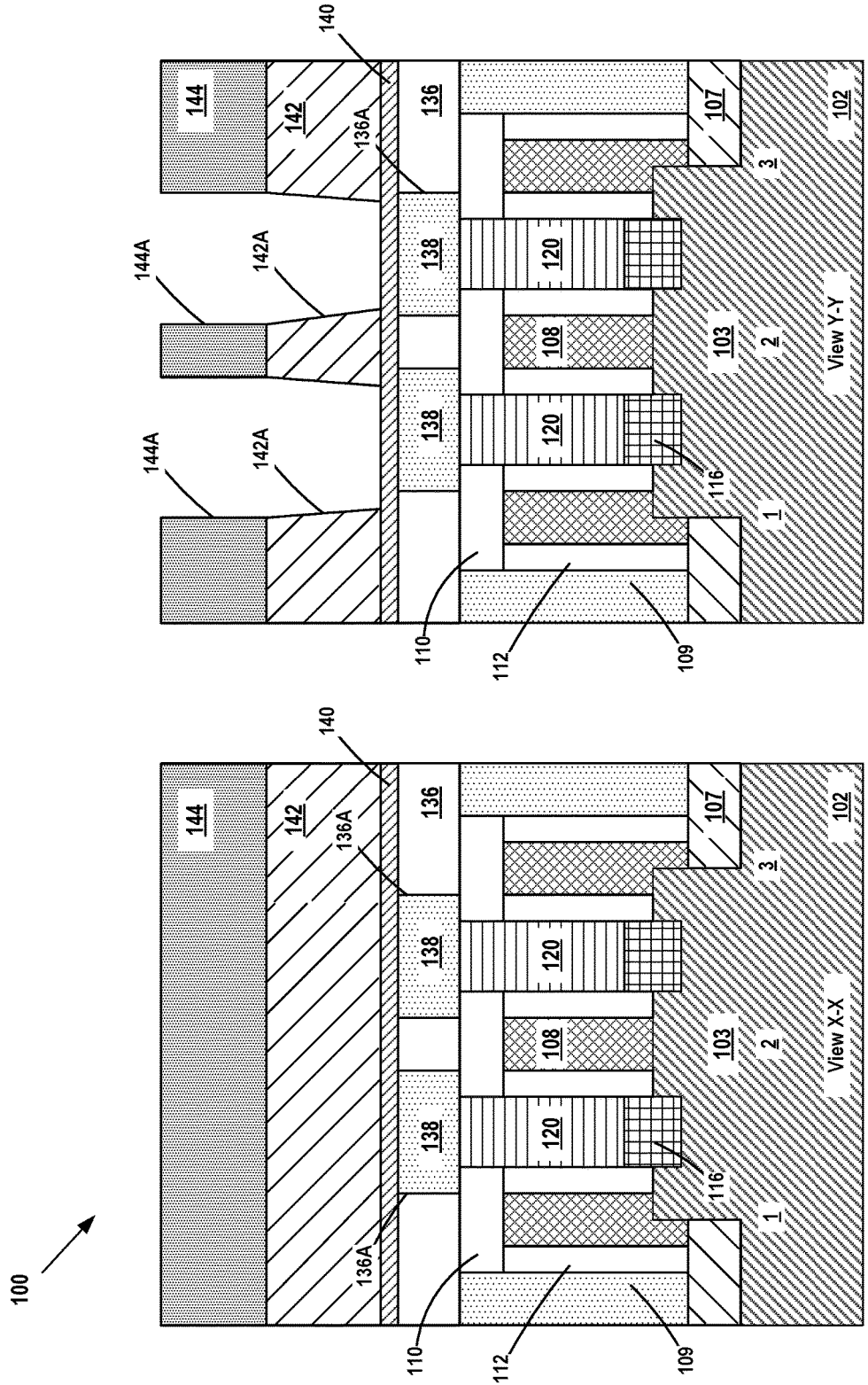

FIG. 9 depicts the product 100 after one or more etching processes were performed though the patterned CA etch mask 144 to remove portions of the insulating material 142. This etching process stops on the etch stop layer 140 and forms openings 142A in the layer of insulating material 142.

Figure 10:
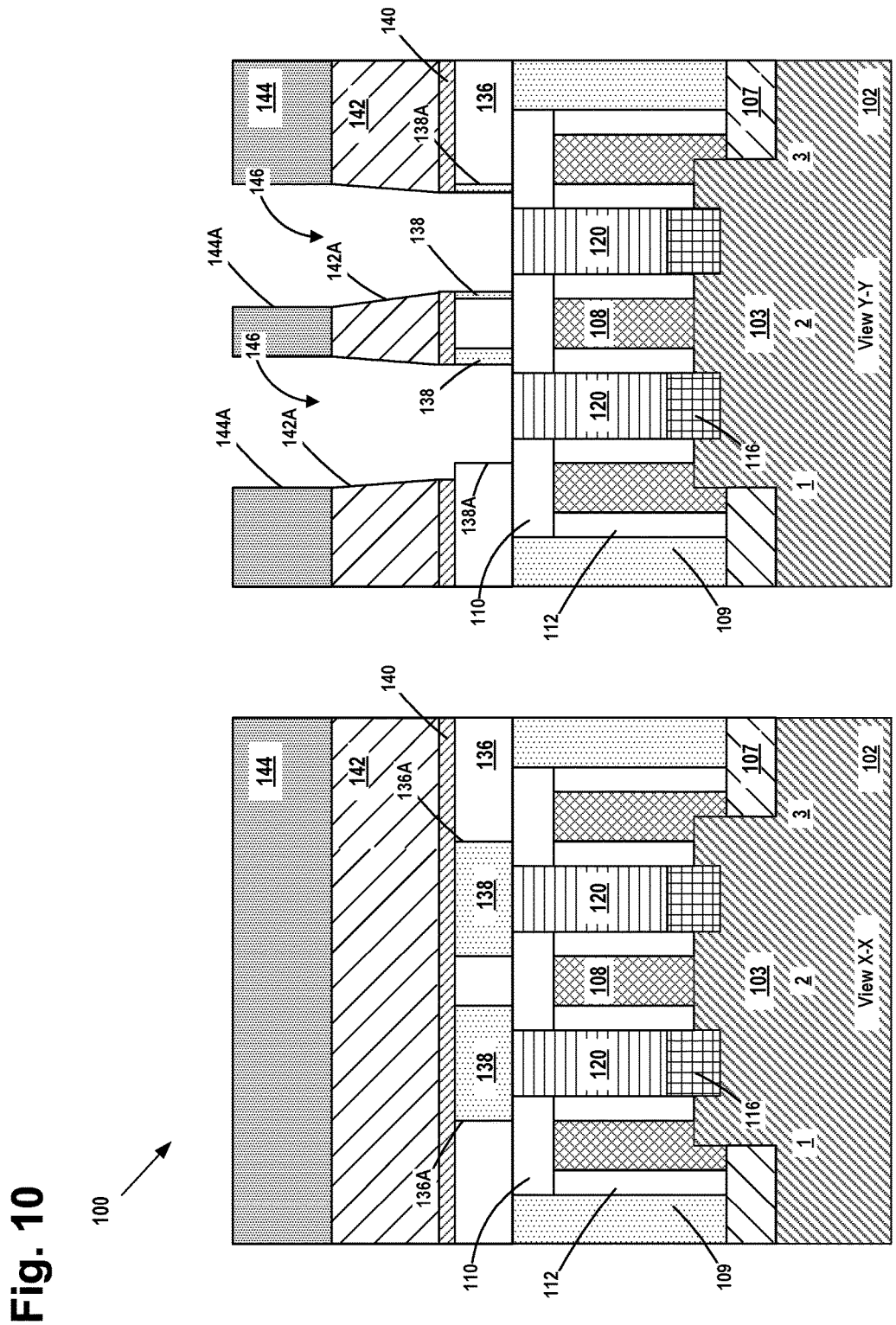

FIG. 10 depicts the product 100 after one or more etching processes were performed though the patterned CA etch mask 144 and the openings 142A in the layer of insulating material 142. In one illustrative example, a first etching process was performed through the patterned CA etch mask 144 to remove exposed portions of the etch stop layer 140 so as to thereby expose portions of the separate, laterally spaced-apart insulating source/drain cap structures 138. This first etching process may also expose portions of the adjacent materials, such as the layer of insulating material 136. Then, a second etching process, e.g., an anisotropic etching process, was performed to remove exposed portions of the insulating source/drain cap structures 138 relative to the surrounding materials, such as the layer of insulating material 136, the gate caps 110 and the source/drain contact structures 120. This etching process forms first and second openings 138A in the layer of insulating material 136 that expose portions of the source/drain contact structures 120. Collectively, these process operations result in the formation of CA contact openings 146, wherein the openings 138A in the layer of insulating material 136 define a part of the contact openings.

Figure 11:
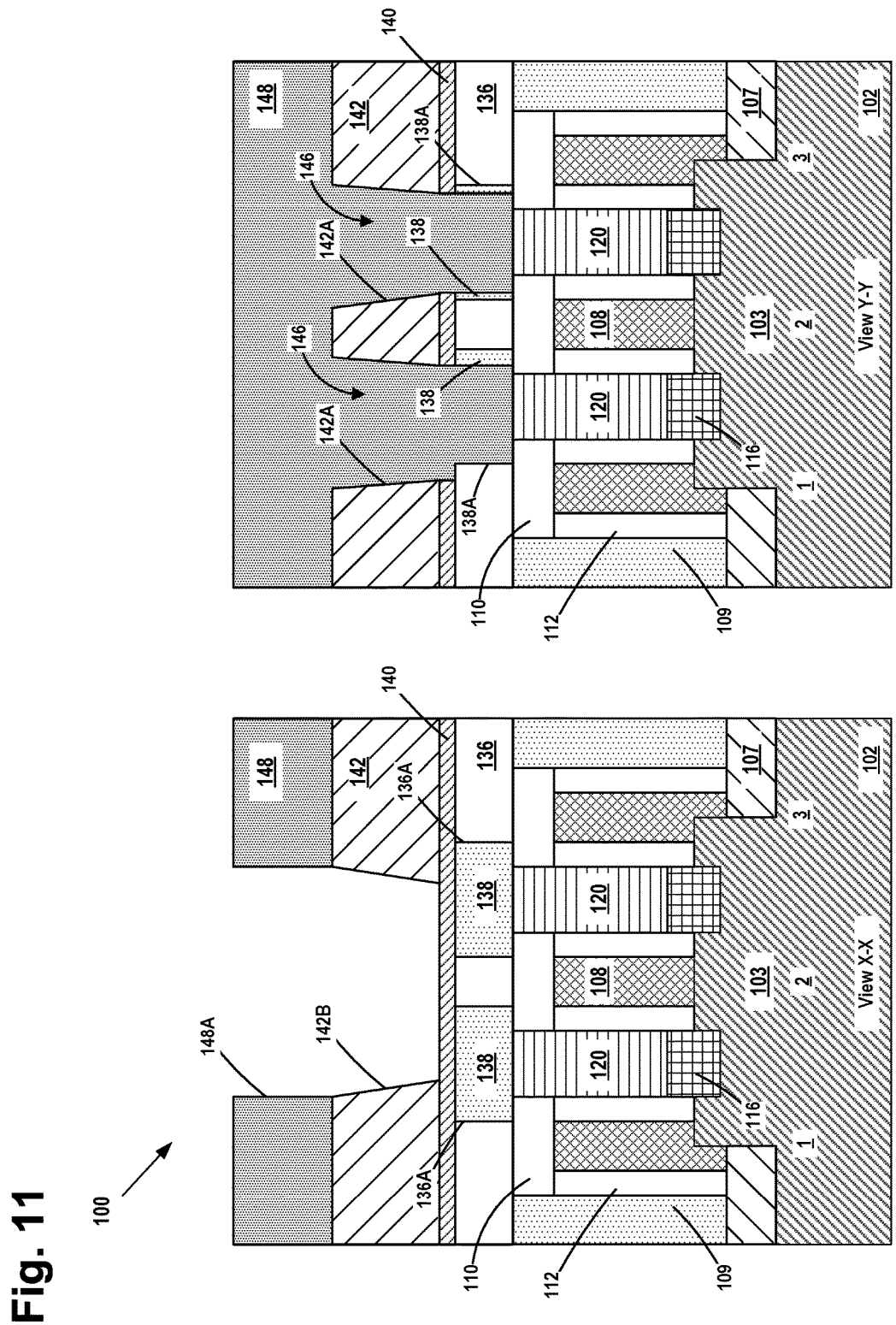

FIG. 11 depicts the product 100 after several process operations were performed. First, the patterned CA etch mask 144 was removed. Then a patterned CB etch mask 148, (e.g., photoresist, OPL) was formed above the layer of insulating material 142. The patterned CB etch mask 148 comprises a CB contact opening 148A. Note that the patterned CB etch mask 148 fills the CA contact openings 146. Then, one or more etching processes were performed though the patterned CB etch mask 148 to form an opening 142B in the layer of insulating material 142. This etching process stops on the etch stop layer 140.

Figure 12:
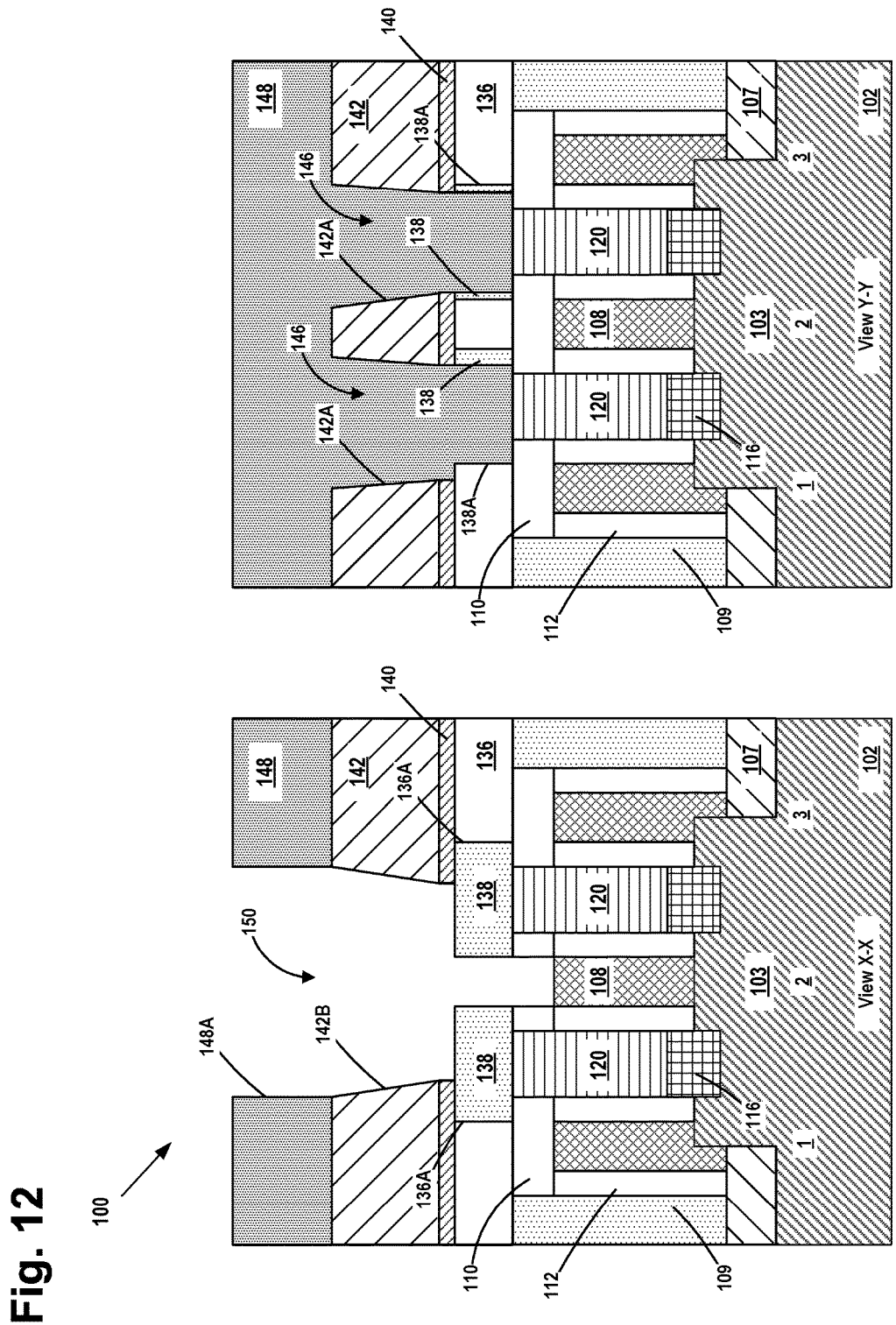

FIG. 12 depicts the product after several process operations were performed. In one illustrative example, a first etching process was performed through the patterned CB etch mask 148 to remove exposed portions of the etch stop layer 140 so as to thereby expose portions of the separate, laterally spaced-apart insulating source/drain cap structures 138 and the insulating material 136 positioned between the insulating source/drain cap structures 138. Then, in one illustrative process flow, a second etching process, e.g., an anisotropic etching process, was performed on the product 100. In this illustrative process flow, the second etching process removes both the exposed portions of the layer of insulating material 136 located in the space between the insulating source/drain cap structures 138 and the then-exposed portion of the gate cap 110 positioned above the gate structure 108 of gate 2. In this illustrative process flow, since the insulating material 136 and the gate caps 110 are made of the same material, e.g., silicon nitride, the second etching process is a single etching process that removes both materials. Of course, if desired, in other process flows, the layer of insulating material 136 and the gate caps 110 may be made of different materials that may not be effectively removed in a single etching step. In such a situation, after the etch stop layer is etched, a first etching process may be performed to remove the portions of the insulating material 136 positioned between the insulating source/drain cap structures 138 and, thereafter, a second etching process may be performed to remove the exposed portions of the gate cap 110 on gate 2. Collectively, these process operations result in the formation of a CB contact opening 150, wherein the space between the insulating source/drain cap structures 138 defines a part of the CB contact opening 150. It should be noted that, in the illustrative process flow depicted herein, the CA contact openings 146 were formed prior to the formation of the CB contact opening 150. However, if desired, the process flow may be reversed.

Figure 13:
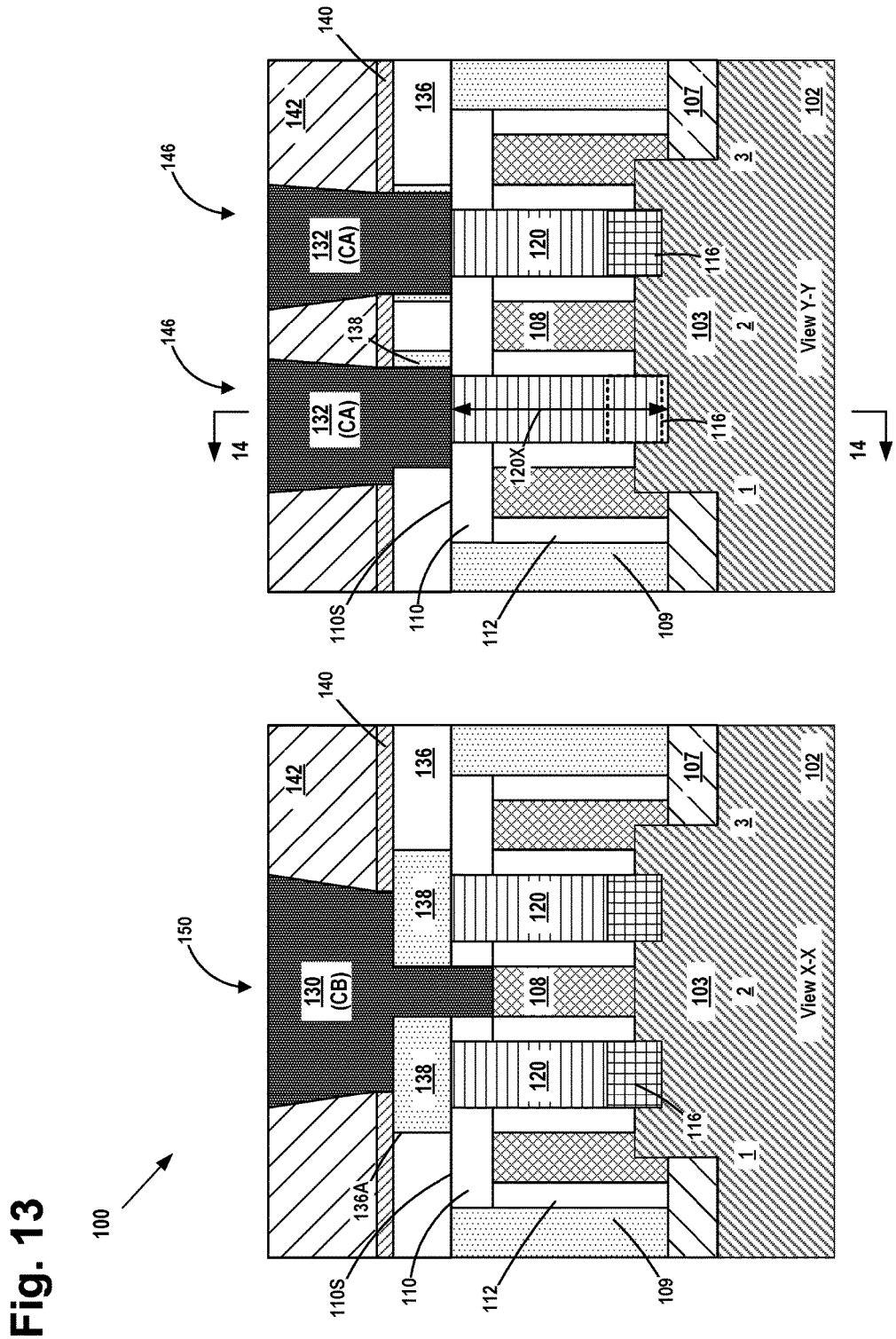

FIG. 13 depicts the product 100 after several process operations were performed. First, the patterned CB etch mask 148 was removed. Thereafter, several process operations were performed to form the CB contact 130 in the CB contact opening 150 and the CA contacts 132 in the CA contact openings 146. First, one or more conformal barrier layers and/or seed layers (not separately shown) were formed so as to line the openings 146, 150 with the barrier material(s). Next, a layer of conductive material (e.g., copper, a metal-containing material, a metal compound, etc.) was then formed on the product 100 so as to overfill the openings 146, 150. At that point, a CMP process was performed to remove excess portions of the conductive materials from above the upper surface of the layer of insulating material 142. These process operations result in the formation of a CB contact 130 that is conductively coupled to the gate structure 108 of gate 2 and a plurality of CA contacts 132, each of which is conductively coupled to one of the source/drain contact structures 120. The CB gate contact 130 is positioned entirely above the active region of the transistor. Also note that the CB gate contact 130 lands on the upper surfaces of the separate laterally spaced-apart insulating source/drain cap structures 138, while the CA contacts 132 extend through openings formed in the insulating source/drain cap structures 138.

Figure 14:
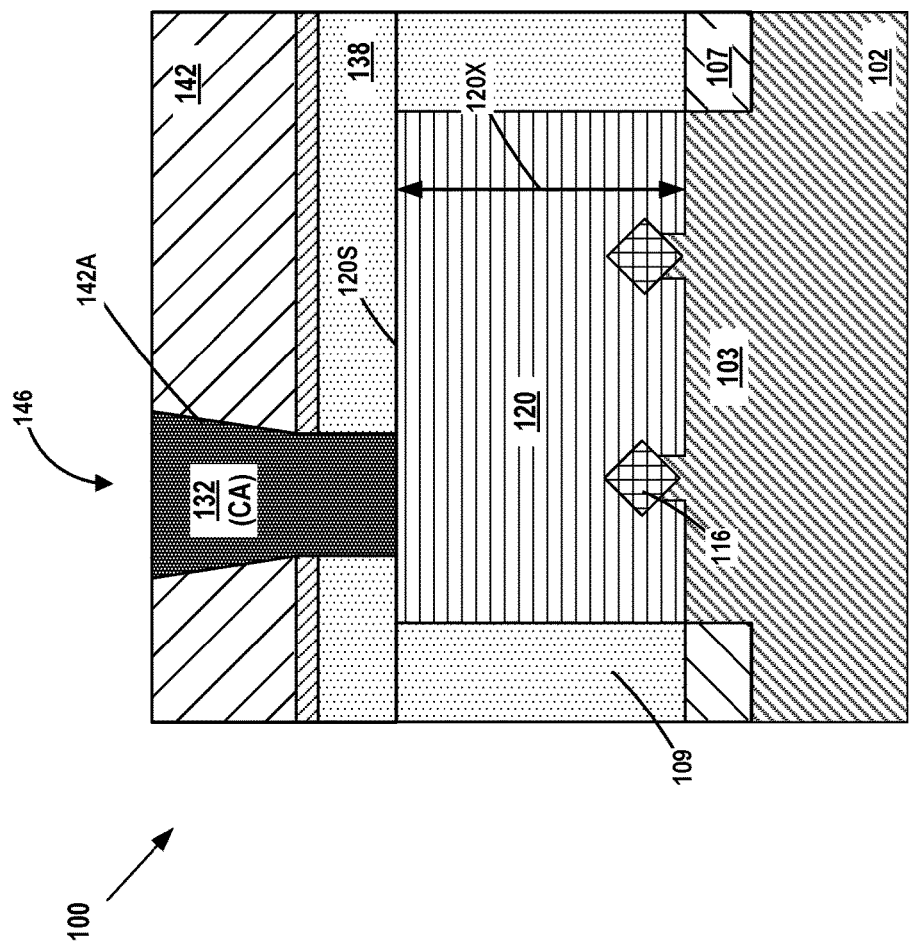

As will be appreciated by those skilled in the art after complete reading of the present application, the presently disclosed subject matter provides novel process flows and structures that may provide several benefits. As indicated in the view Y-Y in FIG. 13, FIG. 14 is a cross-sectional view taken though one of the source/drain contact structures 120 and one of the CA contact structures 132, i.e., in the gate width direction of the transistor devices. For example, using the methods disclosed herein, the CB contact structure 130 may be formed above the active region without recessing a portion of the source/drain contact structures 120. That is, as shown in FIGS. 13 and 14, the source/drain contact structures 120 may be formed with a substantially planar upper surface 120S for substantially the entire length of the source/drain contact structures 120 in the gate width direction of the transistor device. This means that the source/drain contact structures 120 have a substantially uniform thickness 120X in both the gate width (FIG. 14) and gate length (FIG. 13—the epi material 116 is shown in dashed lines in view Y-Y in FIG. 13 so as to show the full vertical thickness 120X of the source/drain contact structures 120) directions of the transistor devices. The substantially uniform thickness source/drain contact structures 120 exhibit less resistance as compared to prior art devices wherein the source/drain contact structures have less conductive materials since the source/drain contact structures in the prior art devices are typically notched or recessed near the gate contact and filled with insulating material so as to prevent a short circuit between the gate and the source/drain region. The reduced resistance exhibited by the novel source/drain contact structures 120 means that the transistor devices may operate more efficiently and with less power consumption. It should also be noted that, in the examples depicted herein, the upper surfaces 120S of the source/drain contact structures 120 are substantially planar with the upper surfaces 110S (see FIG. 13) of the gate caps 110.

Additionally, as noted above, in one embodiment, by selecting the appropriate material for various structures, the CB contact 130 may be formed while only having to address etching of two different materials as opposed to having to address etching of three different materials as is common in some prior art process flows. More specifically, as disclosed above, in one embodiment, the spacers 112, the gate caps 110 and the insulating material 136 may all be made of the same material, e.g., silicon nitride, while the insulating source/drain cap structures 138 may be made of a second material, e.g., silicon dioxide, that is selectively etchable to the single material of the spacers 112, the gate caps 110 and the layer of insulation material 136, thereby resulting in a process flow with fewer steps and one that is easier to perform. With reference to view X-X in FIG. 13, a novel transistor structure is disclosed that comprises a CB gate contact structure 130 that extends through a space or opening between two spaced-apart insulating source/drain cap structures 138 that are positioned above the source/drain contact structures 120 and through an opening formed in the gate cap 110 so as to conductively contact the gate structure 108 of gate 2. In the depicted example, portions of the CB gate contact 130 are in physical contact with the upper surfaces of both of the separate, laterally spaced-apart insulating source/drain cap structures 138. Also note that, in one embodiment, the insulating source/drain cap structures 138 are comprised of a material (e.g., silicon dioxide) that is different than the materials of the gate cap 110, the spacer 112 and the layer of insulating material 136, all of which may be made of the same material, e.g., silicon nitride.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive gate contact structure (CB) for a transistor, said transistor comprising a gate and first and second source/drain contact structures positioned on opposite sides of said gate, said gate comprising a gate structure and a gate cap positioned above said gate structure, the method comprising:
   selectively forming first and second separate, laterally spaced-apart sacrificial conductive source/drain cap structures on and in contact with said first and second source/drain contact structures, respectively;
   selectively removing said first and second separate, laterally spaced-apart sacrificial conductive source/drain cap structures to define first and second openings, respectively, in a layer of insulating material;
   forming first and second separate, laterally spaced-apart insulating source/drain cap structures, respectively, in said first and second openings, respectively, wherein said first and second separate, laterally spaced-apart insulating source/drain cap structures are, respectively, positioned on and in contact with said first and second source/drain contact structures, respectively;
   forming a gate contact opening that extends through a space between said separate, laterally spaced-apart insulating source/drain cap structures and through said gate cap so as to expose a portion of said gate structure; and
   forming said conductive gate contact structure (CB) in said gate contact opening, wherein said conductive gate contact structure (CB) is conductively coupled to said gate structure.

2. The method of claim 1, wherein each of said first and second source/drain contact structures comprises a substantially planar upper surface and wherein selectively forming said first and second separate, laterally spaced-apart sacrificial conductive source/drain cap structures comprises selectively forming said first and second separate, laterally spaced-apart sacrificial conductive source/drain cap structures such that they contact substantially an entirety of said substantially planar upper surface of said first and second source/drain contact structures, respectively.

3. The method of claim 2, wherein said substantially planar upper surface of said first and second source/drain contact structures are substantially planar with an upper surface of said gate cap.

4. The method of claim 1, wherein each of said separate, laterally spaced-apart insulating source/drain cap structures comprises a substantially planar upper surface and wherein forming said conductive gate contact structure (CB) in said gate contact opening comprises forming said conductive gate contact structure (CB) in said gate contact opening such that said conductive gate contact structure (CB) lands on said upper surfaces of said separate, laterally spaced-apart insulating source/drain cap structures.

5. The method of claim 1, further comprising:
forming first and second source/drain contact openings that extend through said first and second separate, laterally spaced-apart insulating source/drain cap structures, respectively, and expose a portion of said first and second source/drain contact structures, respectively; and
forming first and second conductive source/drain contacts (CA) in said first and second source/drain contact openings, respectively, wherein said first conductive source/drain contact (CA) is conductively coupled to said first conductive source/drain contact structure and said second conductive source/drain contact (CA) is conductively coupled to said second conductive source/drain contact structure.

6. The method of claim 1, wherein said gate further comprises a sidewall spacer and wherein said first and second separate, laterally spaced-apart insulating source/drain cap structures are comprised of a first material and said gate cap and said sidewall spacer are comprised of a second material that is different than said first material, wherein said first material is selectively etchable relative to said second material.

7. The method of claim 6, wherein said first material is silicon dioxide and said second material is one of silicon nitride, SiNC, SiN, SiCO and SiNOC.

8. The method of claim 1, wherein said first and second separate, laterally spaced-apart sacrificial conductive source/drain cap structures are comprised of a metal-containing material and said first and second source/drain contact structures comprise a trench silicide material and have a line-type configuration when viewed from above.

9. The method of claim 1, wherein said first and second source/drain contact structures have a substantially uniform vertical thickness throughout a direction corresponding to a gate width of said transistor.

10. A method of forming a conductive gate contact structure (CB) for a transistor, said transistor comprising a gate and first and second source/drain contact structures positioned on opposite sides of said gate, said gate comprising a gate structure and a gate cap positioned above said gate structure, the method comprising:
performing a selective deposition process to selectively form first and second separate, laterally spaced-apart sacrificial conductive source/drain cap structures on and in contact with said first and second source/drain contact structures, respectively;
forming a layer of insulating material between and around said first and second separate, laterally spaced-apart sacrificial conductive source/drain cap structures;
selectively removing said first and second separate, laterally spaced-apart sacrificial conductive source/drain cap structures so as to define first and second openings respectively, in said layer of insulating material, wherein said first and second openings expose said first and second source/drain contact structures, respectively;
forming first and second separate, laterally spaced-apart insulating source/drain cap structures in said first and second openings, respectively, and on and in contact with said first and second source/drain contact structures, respectively;
forming a gate contact opening that extends through a space between said separate, laterally spaced-apart insulating source/drain cap structures and through said gate cap so as to expose a portion of said gate structure; and
forming said conductive gate contact structure (CB) in said gate contact opening, wherein said conductive gate contact structure (CB) is conductively coupled to said gate structure and wherein said conductive gate contact structure (CB) lands on an upper surface of each of said separate, laterally spaced-apart insulating source/drain cap structures.

11. The method of claim 10, wherein each of said first and second source/drain contact structures comprises a substantially planar upper surface and wherein performing a selective deposition process to selectively form said first and second separate, laterally spaced-apart sacrificial conductive source/drain cap structures comprises performing a selective deposition process to selectively form said first and second separate, laterally spaced-apart sacrificial conductive source/drain cap structures such that they contact substantially an entirety of said substantially planar upper surface of said first and second source/drain contact structures, respectively.

12. The method of claim 11, wherein said substantially planar upper surface of said first and second source/drain contact structures are substantially planar with an upper surface of said gate cap.

13. The method of claim 11, wherein forming said first and second separate, laterally spaced-apart insulating source/drain cap structures in said first and second openings, respectively, and on and in contact with said first and second source/drain contact structures, respectively, comprises forming first and second separate, laterally spaced-apart insulating source/drain cap structures in said first and second openings, respectively, and on and in contact with substantially an entirety of said substantially planar upper surface of said first and second source/drain contact structures, respectively.

14. The method of claim 10, further comprising:
forming first and second source/drain contact openings that extend through said first and second separate, laterally spaced-apart insulating source/drain cap structures, respectively, and expose a portion of said first and second source/drain contact structures, respectively; and
forming first and second conductive source/drain contacts (CA) in said first and second source/drain contact openings, respectively, wherein said first conductive source/drain contact (CA) is conductively coupled to said first conductive source/drain contact structure and said second conductive source/drain contact (CA) is conductively coupled to said second conductive source/drain contact structure.

15. The method of claim 10, wherein said gate further comprises a sidewall spacer and wherein said first and second separate, laterally spaced-apart insulating source/drain cap structures are comprised of a first material and said gate cap, said sidewall spacer and said layer of insulating material are comprised of a second material that is different than said first material, wherein said first material is selectively etchable relative to said second material.

16. The method of claim 15, wherein said first material is silicon dioxide and said second material is one of silicon nitride, SiNC, SiN, SiCO and SiNOC.

17. A transistor, comprising:
a gate, said gate comprising a gate structure and a gate cap positioned above said gate structure;
first and second source/drain contact structures positioned on opposite sides of said gate;
first and second separate, laterally spaced-apart insulating source/drain cap structures positioned in a layer of insulating material, said first and second separate, laterally spaced-apart insulating source/drain cap structures being positioned on and in contact with an upper surface of said first and second source/drain contact structures, respectively, wherein a bottom surface of each of said first and second separate, laterally spaced-apart insulating source/drain cap structures is positioned at a level that is above a level of an upper surface of said gate cap;

a gate contact opening that extends through a space between said separate, laterally spaced-apart insulating source/drain cap structures and through said gate cap so as to expose a portion of said gate structure; and a conductive gate contact structure (CB) positioned in said gate contact opening, wherein said conductive gate contact structure (CB) is conductively coupled to said gate structure and wherein said conductive gate contact structure (CB) lands on said upper surface of each of said separate, laterally spaced-apart insulating source/drain cap structures.

18. The transistor of claim 17, further comprising:

first and second source/drain contact openings that extend through said first and second separate, laterally spaced-apart insulating source/drain cap structures, respectively, and expose a portion of said first and second source/drain contact structures, respectively; and first and second conductive source/drain contacts (CA) positioned in said first and second source/drain contact openings, respectively, wherein said first conductive source/drain contact (CA) is conductively coupled to said first conductive source/drain contact structure and said second conductive source/drain contact (CA) is conductively coupled to said second conductive source/drain contact structure.

19. The transistor of claim 17, wherein said gate further comprises a sidewall spacer and wherein said first and second separate, laterally spaced-apart insulating source/drain cap structures are comprised of a first material and said gate cap, said sidewall spacer and said layer of insulating material are comprised of a second material that is different than said first material, wherein said first material is selectively etchable relative to said second material.

20. The transistor of claim 17, wherein each of said first and second source/drain contact structures comprises a substantially planar upper surface that is substantially planar with an upper surface of said gate cap.

\* \* \* \* \*